United States Patent [19]

Root

[11] 4,316,139

[45] Feb. 16, 1982

[54] METHOD AND APPARATUS FOR DETERMINING THE LOCATION OF AN ARC IN A WAVEGUIDE TRANSMISSION LINE OR THE LIKE

[75] Inventor: Errol L. Root, Simi Valley, Calif.

[73] Assignee: International Telephone and Telegraph Corporation, New York, N.Y.

[21] Appl. No.: 48,093

[22] Filed: Jun. 13, 1979

[51] Int. Cl.³ ............................................. G01R 31/08
[52] U.S. Cl. ............................................. 324/52
[58] Field of Search ............... 324/52, 58.5 R, 58.5 A, 324/58.5 B, 58.5 C, 58 R, 58 A, 58 B, 58 C; 179/175.3 F

[56] References Cited

U.S. PATENT DOCUMENTS

| | | | |
|---|---|---|---|
| 2,315,450 | 3/1943 | Nyquist | 324/52 |
| 2,717,992 | 9/1955 | Weintraub | 324/52 X |
| 2,931,975 | 4/1960 | Bechtel | 324/52 |
| 3,173,086 | 3/1965 | Kresge | 324/52 |
| 3,430,136 | 2/1969 | Brustle et al. | 324/52 |
| 3,551,804 | 12/1970 | Weddle | 324/52 |
| 3,588,611 | 6/1971 | Lambden et al. | 324/52 X |
| 3,670,240 | 6/1972 | Maranchak et al. | 324/52 |
| 3,753,086 | 8/1973 | Shoemaker | 324/52 |
| 3,781,665 | 12/1973 | Gale | 324/52 |
| 3,801,899 | 4/1974 | Liao | 324/52 |
| 4,013,948 | 3/1977 | Tanaka et al. | 324/52 |
| 4,158,169 | 6/1979 | Harrold et al. | 324/52 |

FOREIGN PATENT DOCUMENTS 308374 11/1971 U.S.S.R. ............................... 324/52

Primary Examiner—Gerard R. Strecker
Attorney, Agent, or Firm—William T. O'Neil

[57] ABSTRACT

A method and circuit for locating an arc in a waveguide which utilize detectors responsive to the vibratory and electromagnetic disturbances resulting from an arc. Since the disturbances travel at different velocities, the location of the arc can be readily determined. A counter counts time periods between the time of detection of the electromagnetic disturbance and the time of detection of the vibratory disturbance. The length of the time periods is selected so that the quantity counted may be directly displayed as the distance to the arc location.

16 Claims, 3 Drawing Figures

METHOD AND APPARATUS FOR DETERMINING THE LOCATION OF AN ARC IN A WAVEGUIDE TRANSMISSION LINE OR THE LIKE

BACKGROUND OF THE INVENTION

This invention relates to a method and apparatus for locating an arc in a waveguide. Most prior art methods for locating an arc in a waveguide are inefficient or costly and tend to provide results which are only slightly better than mere guess work. The object of this invention is to provide a method and apparatus for locating waveguide arcs with good accuracy at a reasonable cost.

This invention takes advantage of the fact that when an arc occurs in a waveguide both vibratory and electromagnetic disturbances are produced. The disturbances can be detected by appropriate detectors. By measuring the time difference between the time of detection of the electromagnetic and vibratory disturbances, the location of the arc can be located with a high degree of accuracy. The electromagnetic disturbance is typically detected at a directional coupler which will measure a high voltage standing wave ratio (VSWR) in response thereto. This can often be done at no additional cost to the system employing the waveguide inasmuch as directional couplers are frequently used therewith, especially in high power radar applications. A sound transducer is acoustically coupled to the waveguide, preferably in the region of the directional coupler, for detecting the vibratory disturbance. The circuitry coupled to the detectors includes a counter and various timing circuits to measure the time interval between detections. The counter is preferably coupled to a display device via a display decoder and driver circuit. The timing circuits increment the counter at a rate which permits the number outputted from the counter to directly indicate the distance to the arc. Preferably, if the speed of the sound in the waveguide material is N units of distance per unit time then the counter is incremented at a rate of XN, where X is preferably an integer and more preferably a factor of ten. The number displayed at the display device will then be automatically calculated to the nearest 1/N units of distance. Of course, X may be a fractional quantity in some embodiments.

The advantages of the invention, both as to its construction and mode of operation, and the preferred mode of use, will be readily appreciated by those skilled in the art referring to the following detailed description of an illustrative embodiment when considered in conjunction with the accompanying drawings in which like reference numerals refer to the same component throughout the drawings.

DETAILED DESCRIPTION OF AN ILLUSTRATIVE EMBODIMENT

Figure 1:
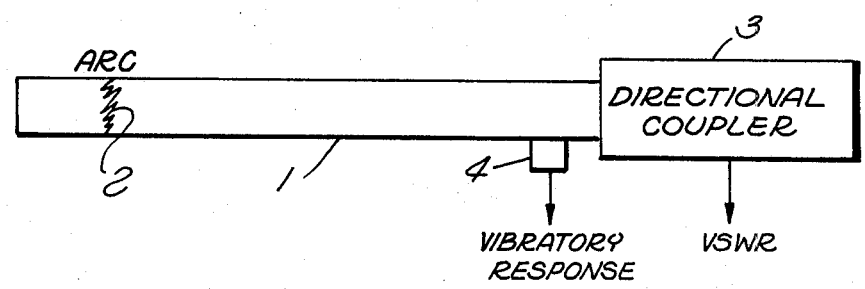
FIG. 1 is a simplified diagram of a waveguide in which a fault or arc is occuring.

Referring now to FIG. 1, there is shown a simplified, representational drawing of a waveguide 1. As is well known in the art, the cross section of a waveguide may be circular, eliptical or rectangular in shape. The waveguide 1 in FIG. 1 is shown in longitudinal cross-section and thus may be either circular, eliptical or rectangular in shape. The waveguide may be of virtually any length; however, the present invention generally becomes more useful with longer and longer waveguides since the prior art problems with finding the location of an arc or fault becomes more severe as the waveguide lengthens. Shown in FIG. 1 is an arc identified by the numeral 2, which can occur in waveguides from time to time when the waveguide has a fault thereat. Of course, since the fault is generally associated with a defect on the interior surface of the waveguide, a mere inspection of the outside of the waveguide generally is not particularly useful in determinating the location of the fault. Furthermore, the fault may occur at virtually any location within waveguide 1.

Waveguides are conventionally coupled to a directional coupling 3 to measure the Voltage Standing Wave Ratio (VSWR), especially in high power radar applications. As part of this invention a sound transducer or vibration disturbance detector 4 is coupled to waveguide 1. When a waveguide arc occurs, both sound and a high VSWR are produced thereby. The directional coupler may be used to detect the high VSWR and the transducer 4 may be used to detect the sound or vibratory response generated by the arc. Preferably, the transducer 4 is located at or adjacent to coupler 3; however, it will soon be appreciated by those skilled in the art that the transducer 4 may be located in other locations along waveguide 1 as well.

Figure 2:
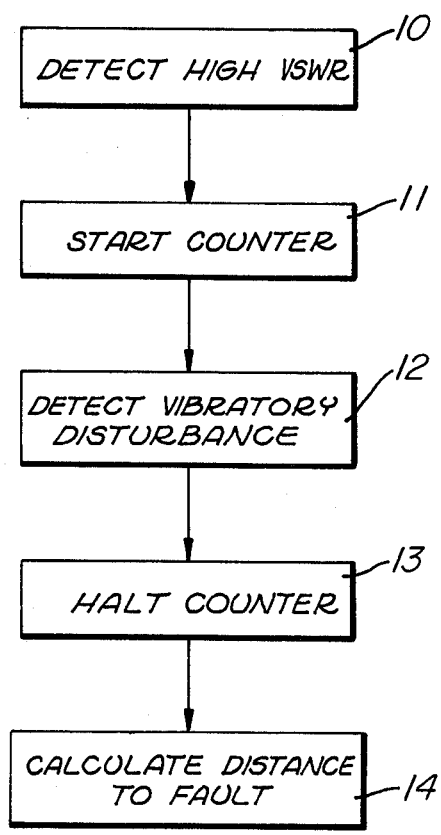
FIG. 2 lists the steps preferably taken to locate the arc in the waveguide when practicing the present invention.

Referring now to FIG. 2, there is listed the steps in the method which are preferably followed according to the present invention to locate the location of arc 2 in waveguide 1 (FIG. 1). First, as denoted by block 10, a high VSWR is detected. I preferably set the threshold level of the high VSWR detector to about 2.5, although others practicing this invention may desire to use other VSWR thresholds; the normal VSWR for the system typically will range from 1.2 to 1.5. After detecting a high VSWR at block 10, which occurs in response to an arc in the waveguide, counting is initiated (block 11) in an electronic counter. At block 12 the vibratory disturbance or sound caused by the arc is detected and counting is then stopped as noted at block 13. Of course, since the sound or vibratory disturbance in waveguide 1 from arc 2 travels much slower than the electromagnetic disturbance or front which produces the high VSWR reading, the counter will count a number of clock cycles indicative of the time which the vibratory disturbance travelled the distance from the fault to transducer 4. Of course, the counter is clocked at a sufficiently high rate to determine the time interval between the occurance of the arc and the detection of the vibratory disturbance with a reasonable degree of accuracy. Having determined the time interval, the distance to the arc may be calculated therefrom, as noted at block 14.

The accuracy of this method is affected by three factors. One factor derives from comparing the propagation rates of sound and electromagnetic waves. If the distance between the transducer and the location of the arc is calculated by taking the time difference between the arrival of the electromagnetic front at the directional coupler 3 and the vibratory disturbance at transducer 4 and multiplying that times the velocity of the vibratory response in the waveguide, then the calculational technique assumes that the detection of the electromagnetic disturbance is instantaneous. It is almost instantaneous and given the fact that the speed of sound in a typical waveguide material, such as aluminum, is much, much slower than the speed of the electromagnetic front, the assumption that it is instantaneous produces an error only on the order of 0.002% which is relatively minor compared to the other possible errors. Moreover, this error can be easily compensated for, especially when the transducer 4 is located at or adjacent to coupler 3 as shown in FIG. 1.

Another factor influencing the accuracy of this method is the accuracy by which the velocity of the vibratory disturbance, that is sound of the waveguide material is known. For example, the "Reference Data for Radio Engineers" indicates that the velocity of sound in aluminum is $2.03 \times 10^5$ i.p.s. (inches per second) whereas the "Handbook of Chemistry and Physics" indicates that the velocity for rolled aluminum is 1.9685 i.p.s. in thin rods, $2.5276 \times 10^5$ i.p.s. for the longitudinal direction in bulk material and $1.1969 \times 10^5$ i.p.s. in the transverse direction. Given the variability of the velocity of sound in aluminum for different physical configurations, the actual velocity of sound should preferably be measured for the actual waveguide configuration and material being employed. In examples set forth below, the velocity is assumed to be $2.03 \times 10^5$ i.p.s. (16900 feet per second).

The third source of error is caused by ambiguities associated with the leading slope of the sound wave. The precise time at which the sound wave exceeds the threshold of the vibratory response detector is determined in part by the frequency of the detected sound wave. Preferably, the transducer 4 is coupled to a broad band amplifier capable of passing not only audio but also ultrasonic frequencies so as to present a sharp rise time to the threshold detector. The detection error should be no more than the first 90° or so of the wave front. For a sound frequency of 15 kHz and given a velocity of propagation of 16900 feet per second, the wave length is about 1.127 feet. Assuming that the leading edge is detected within the first 90°, then the leading edge of the wave front should be detectable within approximately 0.282 feet.

Based upon the foregoing, if the velocity of sound in the waveguide material is accurately known, then this method is able to accurately fix the location of the fault within about ±0.15 feet. In reality an accuracy of ±1 foot would be more than ample to locate and repair a failed waveguide section.

Figure 3:
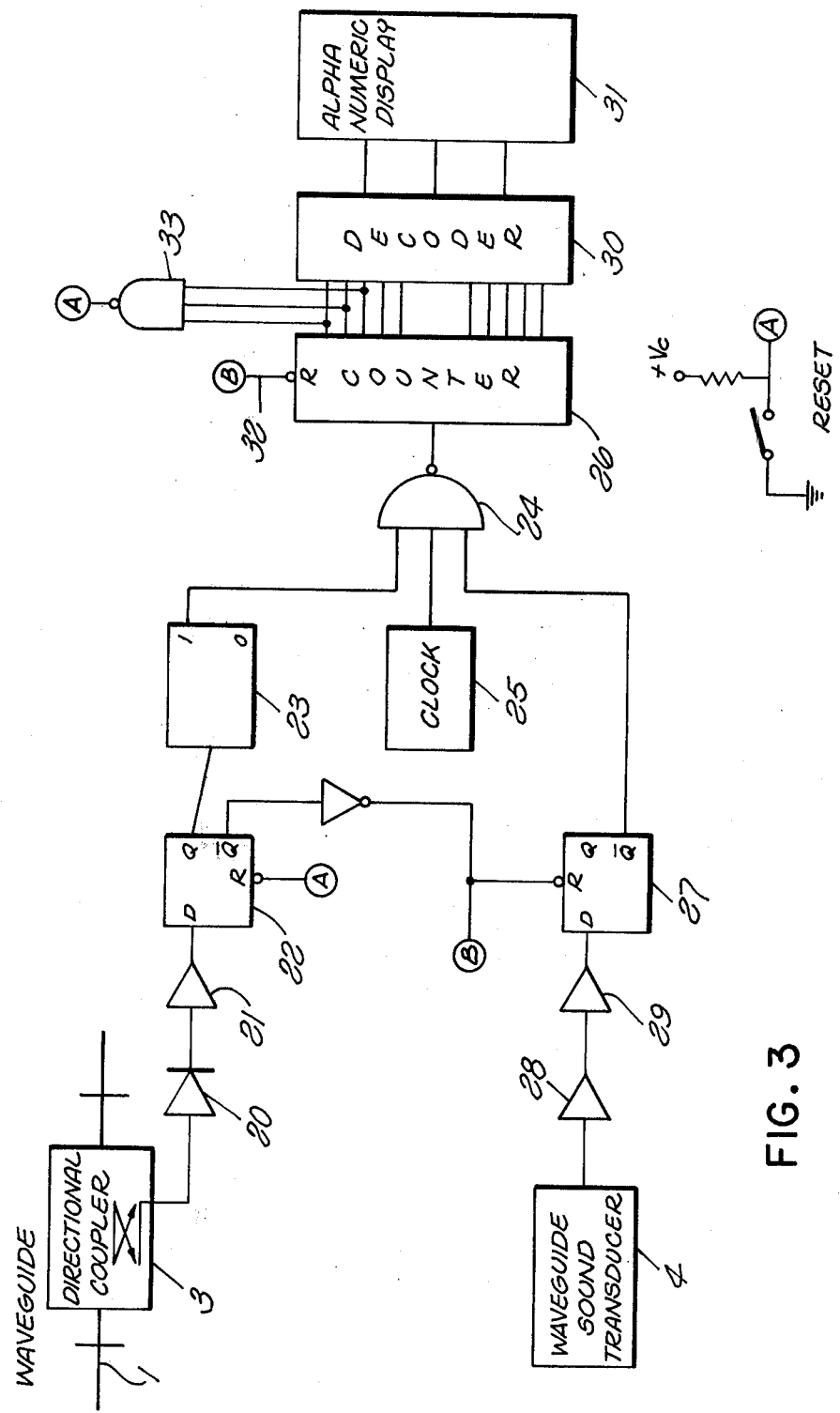
FIG. 3 is a schematic diagram of a logic circuit which may be used to calculate the location of the arc or fault in the waveguide.

Referring now to FIG. 3, there is shown a schematic diagram of a circuit for determining the location of a fault in a waveguide. When an arc occurs in waveguide 1, a high VSWR is generated and the reflected power is coupled by a directional coupler 3 to a diode detector 20. The output of the diode detector is coupled to a comparator or Schmidt trigger circuit 21 which causes flip-flop 22 to set in response to the detected VSWR exceeding a predetermined threshold. A one shot multivibrator 23 is preferably coupled to the output of flip-flop 22. One shot 23 goes high for a predetermined period to allow sufficent time for the sound to travel the distance from the fault to the detector, the predetermined period being on the order of 6 milliseconds for an aluminum waveguide 100 feet long, for instance. Of course the period for one shot 23 would preferably be increased for longer waveguides or shorter waveguides than 100 feet or varied if for waveguide materials other than aluminum.

The output of one shot 23 is coupled to a NAND gate 24 which couples clock 25 to counter 26 from the time flip-flop 22 sets until the time that a flip-flop 27 sets. The waveguide sound transducer 4 is preferably coupled via a wideband amplifier 28, as previously mentioned, to a threshold comparator or Schmidt trigger 29. The level of the threshold output of the Schmidt trigger or comparator 29 is applied to the set input of flip-flop 27. Flip-flop 27 is preferably enabled when flip-flop 22 is set by the detection of a high VSWR and is set in response to a high vibratory disturbance detected at transducer 4. When the vibratory disturbance is detected, the $\overline{Q}$ output from flip-flop 27 goes low thereby inhibiting further transmission of the clock pulses from clock 25 to counter 26 via NAND gate 24. As will be seen, by selecting clock 25 to have appropriate frequency, the output of counter 26, when decoded by a decoder 31 and applied to an alphanumeric display 31, the alphanumeric display will indicate the distance between the location of the transducer 4 and the fault with a high degree of accuracy. An operator may reset the arc locator after having read off the distance to an arc by temporarily closing switch 32.

The radar set will occasionally encounter an abnormally high VSWR which will enable counter 26 but which is not the result of an arc. In such a case the arc locator will respond by initiating counting in counter 26 until stopped when the output of one shot 23 goes low. Since one shot 23 goes high for a predetermined period, a corresponding predetermined number will result in counter 26. The arc locator may then be manually reset by momentarially depressing switch 32 or logic means may be provided to automatically reset the arc locator in this situation. Gate 33 is one embodiment of such logic means. Gate 33, when embodied as a NAND gate as is shown in FIG. 3, is connected to decode when some maximum count is generated in counter 26, such as the maximum count occuring when one-shot 23 times out. Other embodiments of the logic means would test for the non-occurance of $\overline{Q}$ from flip-flop 27 prior to one-shot 23 timing out, for instance.

Preferably, the count which normally accumulates in counter 26 is selected to have a value which represents the distance from transducer 4 to the arc source to the nearest 1/10th foot. If the velocity of the vibratory disturbance in the waveguide material is taken to be 16900 feet per second and if the clock increments the counter at a rate of 169 kHz (that is 10 times the numerical value of the velocity), then the counter is incremented 10 counts per foot between the fault and the transducer 4. Of course, if the transducer 4 and the coupler 3 are located near to each other, the first mentioned error factor can be easily accounted for by assuming that the speed of sound in the waveguide material is about 0.002% faster than it is in actuality. However, in most cases this will be outside the accuracy limits for the measured value of the velocity of sound in the waveguide material. Also, if the clock increments the counter at other rates, then the display device will display the distance to the fault in other units. For example, incrementing the clock at 1.69 mHz results in a display down to the nearest one hundredth foot while incrementing the clock at 16.9 kHz results in a display only to the nearest foot. Of course, the distance can be displayed in metric or mixed units of distance as well. For example, since the assumed velocity is 5156 meters per second, incrementing the counter 515.6 kHz results in the distance being displayed to the nearest centimeter. Thus if the speed of sound in the waveguide material is N units of distance per unit time and the counter is incremented at a rate of XN, where X is preferably an integer and more preferably a power of ten, then the number displayed at the display device will be calculated to the nearest 1/N unit of distance. Of course, the value of N may be altered somewhat to correct for other errors, as aforementioned, if desired.

In the embodiment shown in FIG. 3, the count in the counter is displayed at the alphanumeric display until such a time as the reset switch 32 is closed. Of course, as a matter of design choice, this reset could automatically occur at some predetermined time, if desired. Flip-flop 27 and counter 26 are preferably held in the reset state by the logic signal on line 32 until a high VSWR condition is detected to ensure that both flip-flop 27 and the counter 26 will be in the proper state when a high VSWR occurs. Those skilled in the art will recognize, of course, that one shot 23 may be eliminated if desired and that other changes may be made to the circuitry of FIG. 3, if desired, without departing from the essence of the invention.

In practice, a given transmitter design incorporating the arc locator will be coupled to one of a small number of available waveguide designs. Therefore the locator may include a switch or jumper wire arrangement to facilitate changing the frequency of clock 25. The switch or jumper wire arrangement may be used, if desired, to select the rate at which counter 26 counts to correspond to the velocity at which sound travels in the particular waveguide being used with the transmitter.

I have not shown detailed circuits for the various elements depicted in FIG. 3 inasmuch as the design of the flip-flops, Schmidt triggers or comparators, one shot, counter, etc are conventional and moreover, are generally available as standard TTL (Transistor-Transistor Logic) devices.

Having described the invention in connection with specific embodiments thereof, it is to be understood that further modification that may now suggest itself to those skilled in the art. It is to be understood that the invention is not limited to the specific embodiments described except as set forth in the appended claims.

What is claimed is:

1. A method of locating an arc in a waveguide comprising the steps of:
   (a) detecting, at an arbitrary point along said waveguide, standing waves corresponding to initiation of an electromagnetic disturbance in said waveguide;
   (b) detecting at a predetermined location, a vibratory disturbance in the waveguide resulting from the arc;
   (c) measuring the time interval occurring between initiation of said electromagnetic disturbance and detection of said vibratory disturbance; and
   (d) using the measured time interval to calculate the distance between the location of said arc and said predetermined location.

2. The method according to claim 1, wherein the measuring step includes the steps of counting in a counter circuit according to a predetermined clock between the time of detection of the electromagnetic disturbance and the time of detection of the vibratory disturbance.

3. The method according to claim 2, wherein the velocity of the vibratory disturbance has been determined to be N units of length per unit of time and wherein the predetermined clock causes said counter to count at a rate of XN counts per said unit of time, where X is an integer.

4. The method according to claim 3, wherein X is an integer which is a power of ten.

5. The method according to claims 1 or 3, wherein the vibratory disturbance is detected by a sound transducer acoustically coupled to said waveguide.

6. The method according to claim 5, wherein the electromagnetic disturbance is detected by a directional coupler.

7. The method according to claim 6, wherein the outputs of the sounds transducer and the directional coupler are coupled with preselected threshold levels.

8. Apparatus for locating an arc in a waveguide comprising:
   (a) first means for detecting standing waves at an arbitrary point along said waveguide said standing waves corresponding to initiation of an electromagnetic disturbance in said waveguide resulting from said arc;
   (b) second means for detecting a vibratory disturbance corresponding to said electromagnetic disturbance in the waveguide resulting from said arc, said second means being disposed at a predetermined location along said waveguide and in acoustic contact therewith;
   (c) counter means responsive to said first and second means for measuring the time interval between initiation of said electromagnetic disturbance and detection of said vibratory disturbance; and
   (d) third means for calculating the distance between the location of the arc and said predetermined location based upon the measured time interval and the speed of vibratory disturbances in said waveguide.

9. The apparatus according to claim 8, wherein said second means includes a sound transducer acoustically coupled to said waveguide at said predetermined location, and said first means includes a directional coupler.

10. The apparatus according to claim 8, wherein said counter means includes a counter which is clocked at a predetermined rate for said time interval.

11. The apparatus according to claim 10, wherein the velocity of said vibratory disturbance in said waveguide is N units of length per unit of time and wherein said predetermined rate is XN counts per said unit of time, where X is a predetermined integer.

12. The apparatus according to claim 11, wherein X is an integer which is a power of ten.

13. The apparatus according to claims 10 or 12, wherein the output of said counter is coupled to a display device for displaying the contents of said counter thereat.

14. The apparatus according to claim 13, wherein said first and second means for detecting an electromagnetic disturbance and for detecting a vibratory disturbance are coupled via respective flip-flops and a logic gate to said counter.

15. The apparatus according to claim 14, further including a clock for clocking said counter at said predetermined rate, said clock also being coupled to said counter via said logic gate.

16. The apparatus according to claim 15, further including first threshold determining circuit means coupled between said means for detecting an electromagnetic disturbance and said logic gate and second threshold determining circuit means coupled between said means for detecting a vibratory disturbance and said logic gate.

* * * * *